United States Patent
Buss

(10) Patent No.: US 7,023,018 B2
(45) Date of Patent: Apr. 4, 2006

(54) SIGE TRANSISTOR WITH STRAINED LAYERS

(75) Inventor: Dennis Darcy Buss, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/818,731

(22) Filed: Apr. 6, 2004

(65) Prior Publication Data

US 2005/0224798 A1    Oct. 13, 2005

(51) Int. Cl.
*H01L 29/12* (2006.01)

(52) U.S. Cl. .................. 257/63; 257/65; 257/192; 257/616

(58) Field of Classification Search ........ 257/E29.084, 257/E29.085, E29.105, 63, 65, 190, 192, 257/616, E29.193
See application file for complete search history.

(56) References Cited

U.S. PATENT DOCUMENTS

| | | | | |
|---|---|---|---|---|
| 4,994,866 A | * | 2/1991 | Awano | 257/190 |
| 6,319,799 B1 | * | 11/2001 | Ouyang et al. | 438/528 |
| 6,498,359 B1 | * | 12/2002 | Schmidt et al. | 257/190 |
| 6,621,131 B1 | * | 9/2003 | Murthy et al. | 257/408 |
| 6,657,223 B1 | * | 12/2003 | Wang et al. | 257/19 |
| 6,690,043 B1 | * | 2/2004 | Usuda et al. | 257/194 |
| 6,903,384 B1 | * | 6/2005 | Hsu et al. | 257/192 |
| 2002/0008289 A1 | * | 1/2002 | Murota et al. | 257/369 |
| 2004/0173815 A1 | * | 9/2004 | Yeo et al. | 257/192 |
| 2004/0256614 A1 | * | 12/2004 | Ouyang et al. | 257/20 |

* cited by examiner

*Primary Examiner*—Allan R. Wilson
(74) *Attorney, Agent, or Firm*—Peter K. McLarty; W. James Brady, III; Frederick J. Telecky, Jr.

(57) ABSTRACT

The present invention provides, in one embodiment, a P-type Metal Oxide Semiconductor (PMOS) device (100). The device (100) comprises a tensile-strained silicon layer (105) located on a silicon-germanium substrate (110) and silicon-germanium source/drain structures (135, 140) located on or in the tensile-strained silicon layer (105). The PMOS device (100) further includes a channel region (130) located between the silicon-germanium source/drain structures (135, 140) and within the tensile-strained silicon layer (105). The channel region (130) has a compressive stress (145) in a direction parallel to an intended current flow (125) through the channel region (130). Other embodiments of the present invention include a method of manufacturing the PMOS device (200) and a MOS device (300).

16 Claims, 3 Drawing Sheets

SIGE TRANSISTOR WITH STRAINED LAYERS

TECHNICAL FIELD OF THE INVENTION

The present invention is directed, in general, to the manufacture of semiconductor devices and, more specifically, to a method of fabricating transistor devices having improved drive currents.

BACKGROUND OF THE INVENTION

The continuing push to produce faster semiconductor devices with lower power consumption has resulted in device miniaturization. In particular, smaller gate oxide thickness and silicon channel width are conducive to the low voltage and faster operation of transistor devices, such as complementary metal oxide (CMOS) transistors. With shrinking process geometries, the use of new materials is being explored to further reduce power consumption and increase device switching speeds.

In an N-type metal Oxide Semiconductor (NMOS) transistor, for instance, a channel made from a silicon layer that is epitaxially grown on a silicon-germanium substrate has an increased electron mobility. This, in turn, allows the production of NMOS transistors having faster transistor switching speed and higher drive current.

Increased electron mobility is thought to be due to the presence of biaxial tensile strain in the NMOS channel. It is known that the wider lattice spacing of the silicon-germanium substrate causes the lattice spacing of silicon atoms in the silicon layer to be stretched or strained to match that of the silicon-germanium substrate. Strain in the channel occurs biaxially, that is, in directions parallel and perpendicular to the flow of current through the channel.

In contrast, the use of biaxially tensile-strained-silicon in a P-type Metal Oxide Semiconductor (PMOS) transistor is much less beneficial. A PMOS channel formed in biaxially tensile strained silicon has little, if any, improvement in hole mobility compared to an equivalent channel formed in unstrained silicon. This is a major barrier to preparing CMOS semiconductor devices on strained silicon layers, where both PMOS and NMOS transistors are present. This follows because the drive current of both types of transistors must be increased to realize an improvement in device performance. One approach to increase the drive current of PMOS transistors is to form epitaxial silicon-germanium source/drain structures that provide uniaxial compressive stress to the channel in a direction parallel to the electron flow.

Accordingly, what is needed in the art is an improved method of manufacturing MOS transistors on strained-silicon that improves the drive current for both NMOS and PMOS transistors while not suffering the deficiencies of previous approaches.

SUMMARY OF THE INVENTION

To address the above-discussed deficiencies of the prior art, the present invention provides a PMOS device. The PMOS device comprises a tensile-strained silicon layer located on a silicon-germanium substrate and silicon-germanium source/drain structures on or in the tensile-strained silicon layer. The device also has a channel region located between the silicon-germanium source/drain structures and within the tensile-strained silicon layer. The channel region has a compressive stress in a direction parallel to an intended current flow through the channel region.

Another embodiment of the present invention is a method of manufacturing a PMOS device. The method includes epitaxially growing a tensile-strained silicon layer on a silicon-germanium substrate and removing portions of the tensile-strained silicon outside of a channel region. The method also includes epitaxially growing silicon-germanium source/drain structures on or in the tensile-strained silicon layer.

Still another embodiment of the present invention is directed to a Metal Oxide Semiconductor (MOS) device. The metal oxide device includes a PMOS transistor, which in turn, comprises a tensile-strained silicon layer located on a silicon-germanium substrate and p-doped silicon-germanium source/drain structures on or in the tensile-strained silicon layer. The PMOS transistor also includes an n-type channel region located between the p-doped silicon-germanium source/drain structures and within the tensile-strained silicon layer. The n-type channel region further has a compressive stress in a direction parallel to an intended current flow through the n-type channel region. The MOS device also includes an N-type metal Oxide Semiconductor (NMOS) transistor. The NMOS transistor comprises n-doped source/drain structures located in or on the tensile-strained silicon layer. The NMOS transistor also includes a p-type channel region located between the n-doped source/drain structures and within the tensile-strained silicon layer. The p-type channel has a tensile strain in directions parallel and perpendicular to an intended current flow through the p-type channel region.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that, in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention benefits from studying the effects that strain has on the mobility of charge carriers in silicon. In particular, the effect of biaxially tensile-strained silicon was analyzed by studying the individual effects of uniaxial tensile strain in directions parallel and perpendicular to the direction of current flow in the silicon. The present studies reveal that tensile strain in a direction parallel to the direction of current flow through the channel region of a PMOS device decreases carrier mobility. In addition, tensile strain in a direction perpendicular to the direction current flow increases carrier mobility. Consequently, for practical germanium concentrations in a silicon-germanium substrate (e.g., less than about 30%), there is no net improvement, and in some instances a decrease, in the mobility of holes in biaxially tensile-strained silicon in PMOS devices. Thus, the reason why biaxially tensile-strained silicon does not improve drive current in PMOS devices is that a uniaxial stress parallel to current flow degrades current flow and substantially cancels an improvement in current flow from uniaxial stress perpendicular to current flow. These observations lead to the realization that the mobility in such strained-silicon could be improved by reducing the extent of tensile strain in the direction parallel, but not in the direction perpendicular, to current flow.

The present invention combines epitaxial silicon-germanium source/drain structures and biaxial tensile-strained silicon to provide a PMOS device. The compressive stress from the silicon-germanium source/drain structures partially reduces or cancels the deleterious uniaxial stress parallel to current flow. This occurs without impeding the beneficial effects that result from uniaxial tensile stress perpendicular to current flow.

Figure 1:
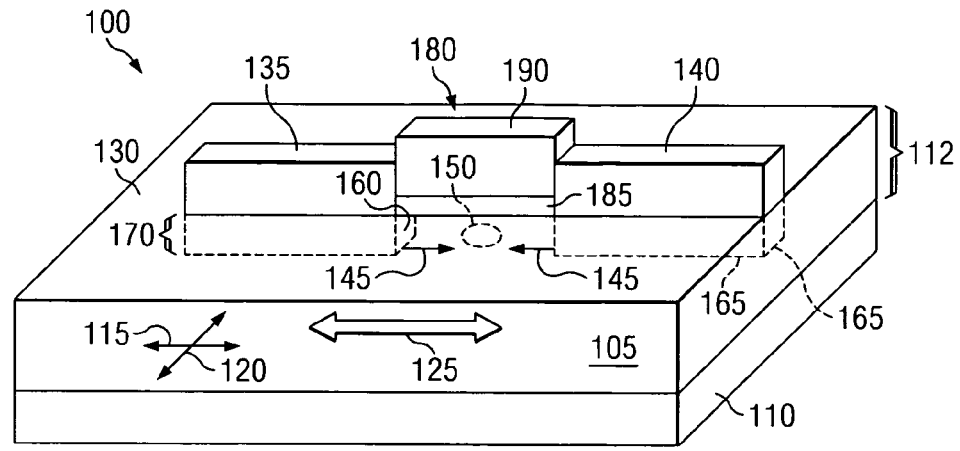
FIG. 1 illustrates a partial perspective view of an exemplary PMOS device of the present invention.

One embodiment of the present invention is illustrated in FIG. 1, which illustrates a partial perspective view of an exemplary PMOS device 100. A tensile-strained silicon layer 105, is located on a silicon-germanium substrate 110. In certain embodiments the tensile-strained silicon layer 105 has a thickness 112 between about 10 and about 20 nanometers. There is biaxial tensile strain in the silicon layer 105 because the silicon layer 105 is epitaxially grown on the silicon-germanium substrate 110. The tensile-strained silicon layer 105 has parallel and perpendicular tensile strain 115, 120, where the directions of strain are designated with respect to the intended direction of current flow 125 through a channel region 130 in the tensile-strained silicon layer 105.

The magnitude of biaxial tensile strain in the silicon layer 105 can be varied by changing the composition of the silicon-germanium substrate 110. In general, higher amounts of germanium in the silicon-germanium substrate 110 cause the silicon layer 105 to have a higher magnitude of tensile strain in both parallel and perpendicular directions 115, 120. For example, in some embodiments of the PMOS device 100, the silicon-germanium substrate 110 comprises a silicon alloy having between about 2 atom percent and about 50 atom percent germanium. In some preferred embodiments, the germanium content of the substrate 110 is between about 20 and about 30 atom percent. In addition, the extent of biaxial tensile strain in the tensile-strained silicon layer 105 depends on the crystal orientation of the silicon layer 105. The present invention is advantageous when the tensile-strained silicon layer has a (110) orientation relative to the direction of current flow.

As further illustrated in FIG. 1, the PMOS device also includes silicon-germanium source/drain structures 135, 140 located on or in the tensile-strained silicon layer 105. Although the silicon-germanium source/drain structures 135, 140 could refer to deep source/drains, they could also refer t0 source/drain extensions, or both structures. Additionally, the deep source/drain structures 135, 140 could extend down into the silicon-germanium substrate 110. The channel region 130 is located substantially between the silicon-germanium source/drain structures 135, 140. The silicon-germanium source/drain structures 135, 140 transmit a uniaxial compressive stress 145 to the channel region 130 in the direction parallel to the intended current flow 125.

The net strain 150 in the channel region 130 in the direction parallel to the intended direction of current flow 125 is governed by the sum of compressive stress 145 and parallel tensile stress 115. As previously noted, the compressive stress 145 is imparted to the channel region 130 via the silicon-germanium source/drain structures 135, 140. The parallel tensile stress 115 in the channel 130 is imparted to the tensile-strained silicon layer 105, including the channel region 130, via the silicon-germanium substrate 110.

In some instances, the magnitude of the compressive stress 145 is substantially greater than the magnitude of the parallel tensile stress 115. The magnitude of the compressive stress 145, for example, can be about 10 percent greater than the magnitude of the parallel tensile stress 115. Of course, in other instances, the magnitude of the compressive stress 145, can be less than the magnitude of the parallel tensile stress 115. Thus, in some instances, the net strain 150 can be a tensile strain while in other instances the net strain 150 can be a compressive strain. In either of these instances, however, the net strain 150 in the parallel direction 125 is less tensile or more compressive than the perpendicular tensile strain 120. In other instances, the compressive stress 145 is substantially equal (e.g., within about 10 percent) in magnitude to a parallel tensile stress 115. In these embodiments, the net strain 150 is substantially zero, while the tensile strain in the perpendicular direction 120 is non-zero.

The magnitude of the compressive stress 145 can be adjusted as desired in the direction parallel to intended current flow 125, by changing the composition of the silicon-germanium source/drain structures 135, 140. In some devices 100, the silicon-germanium source/drain structures 135, 140 comprise a silicon alloy having between about 30 atom percent and about 50 atom percent germanium. In certain device configurations, the magnitude of compressive stress 145 is at least about 1 GPa, while in other configurations the compressive stress 145 is between about 1 and about 1.5 GPa.

The magnitude of the compressive stress 145 can also be adjusted by controlling the amount of the silicon-germanium source/drain structures 135, 140 that are located on sides 160 of the channel region 130. The compressive stress 145 increases as more of the silicon-germanium source/drain structures 135, 140 contacts the channel's sides 160. In some embodiments, to increase the extent of contact between the source/drain structures 135, 140, and the channel region 130, portions of the tensile strained-silicon layer 105 are removed, and the silicon-germanium source/drain structures 135, 140 are formed on the portions of the strained-silicon layer thereby exposed 165. In other instances, however, sufficient portions of the strained-silicon layer 105 are removed to allow the silicon-germanium source/drain structures 135, 140 to be on the underlying silicon-germanium substrate 110. For example, in certain cases, the thickness of the portion of the strained-silicon layer removed 170 is between about 1 and about 10 nanometer thickness, while in other cases, the entire thickness 112 of the portion is removed.

For a tensile stress 120 equal to about 1 GPa in a direction perpendicular to the direction of current flow 125, carrier mobility can be at least about 60 percent greater than carrier mobility in a substantially similar channel made of unstrained silicon. This can advantageously result in the PMOS device 100 having a drive current that is substantially higher than a drive current of a substantially similar PMOS device having a channel made of unstrained silicon. In some cases, for example, the drive current of the PMOS device of the present invention is at least about 15 percent higher than the above-mentioned substantially similar PMOS device.

As further illustrated in FIG. 1, the PMOS device 100 can include other conventional semiconductor device components, such as a gate structure 180, comprising a gate dielectric 185 and gate electrode 190. Although not shown, one skilled in the art would also understand how to add other components, including gate sidewalls, source/drain extensions and isolation structures, to form the operative PMOS transistor device 100.

Figure 2A:
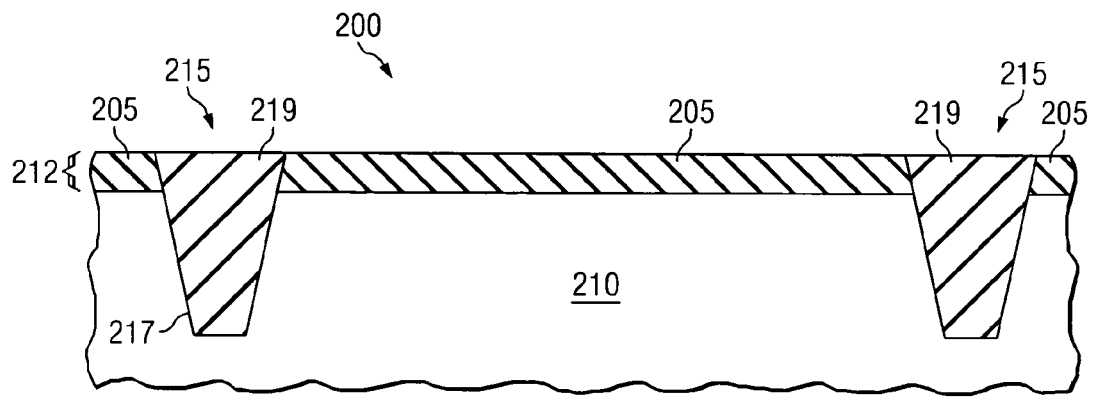
FIGS. 2A to 2E illustrate partial sectional views of selected steps in a method for manufacturing a PMOS device according to the principles of the present invention.

Yet another aspect of the present invention is a method of manufacturing a PMOS device. FIGS. 2A and 2E illustrate selected steps in an exemplary method of manufacturing a PMOS device 200 according to the principles of the present invention. Any of the above-described embodiments of the PMOS device 100, such as depicted in FIG. 1, may be manufactured according to the method of the present invention.

Turning first to FIG. 2A, illustrated is the partially completed P-type Metal Oxide Semiconductor (PMOS) device after epitaxially growing a tensile-strained silicon layer 205 on a silicon-germanium substrate 210. Those skilled in the art are familiar with conventional procedures used to epitaxially grow the tensile-strained silicon layer 205. In some advantageous embodiment, chemical vapor deposition (CVD) or molecular beam epitaxy is used to form the silicon layer 205. In certain embodiments, it is desirable to epitaxially grow the tensile-strained silicon layer 205 to a thickness 212 of about 20 nanometers, although other thicknesses can be used. FIG. 2A also illustrates the partially completed PMOS device 200 after forming device isolation regions 215 by using conventional lithography processes to form a trench 217 in the tensile-strained silicon layer 205 and silicon-germanium substrate 210 and then depositing a field oxide 219 in the trench 217.

Figure 2B:
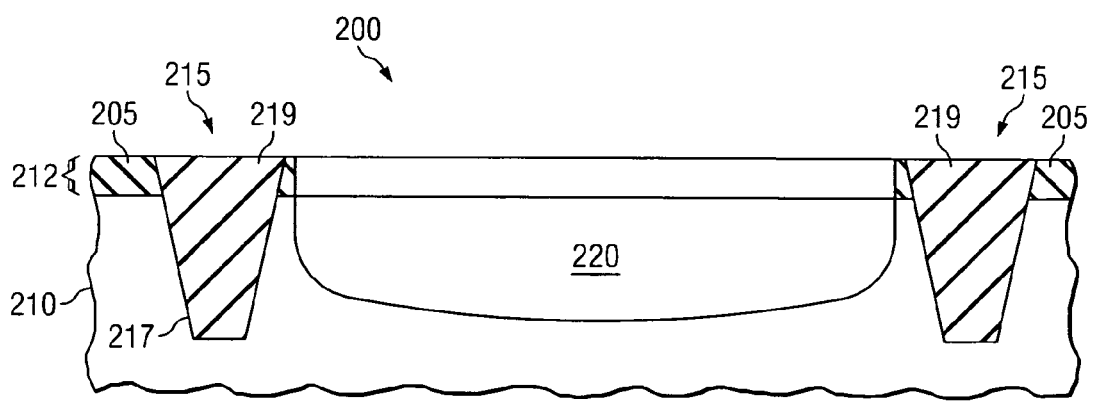

FIG. 2B shows the partially completed PMOS device 200 after forming an n-well 220 in the tensile-strained silicon layer 205 and silicon-germanium substrate 210. Those skilled in the art are familiar with the procedures used to implant and anneal n-type dopants, such as phosphorus or arsenic, to form the n-well 220. Suitable n-dopant concentrations range between about $1 \times 10^{17}$ and about $5 \times 10^{17}$ atoms/cm$^3$. Of course, the selection of dopant type and concentration depends on the desired performance characteristics of the PMOS device 200 being manufactured.

Figure 2C:
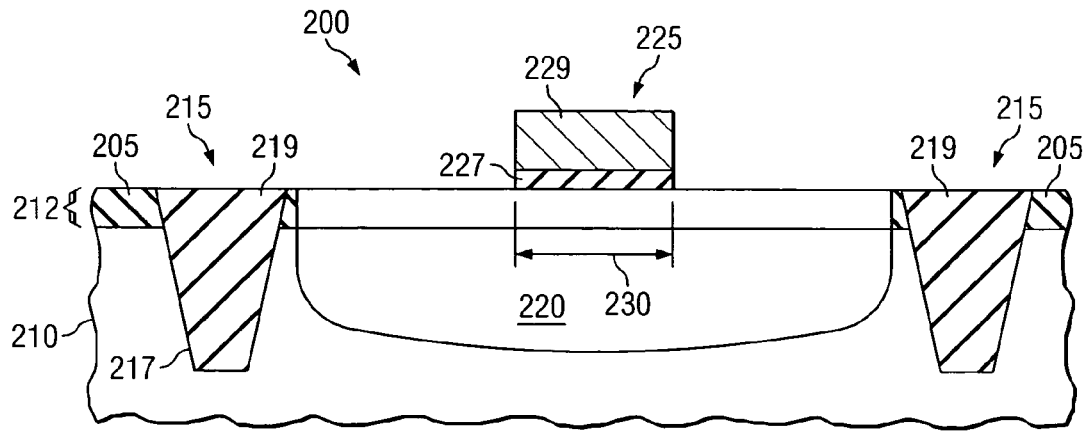

Referring now to FIG. 2C, illustrated is the partially completed PMOS device 200 after forming a gate structure 225. Conventional oxidation, deposition and lithographic procedures can be used to deposit and pattern oxide and polysilicon layers to form a gate dielectric 227 and gate electrode 229, respectively. Of course, other well-known materials may also be used to form the gate structure 225. In certain submicron applications, the gate structure 225 has a length 230 of less than about 50 nanometers, and more preferably, between about 10 and 40 nanometers. Of course, other gate lengths 230 are also within the scope of the present invention.

Figure 2D:
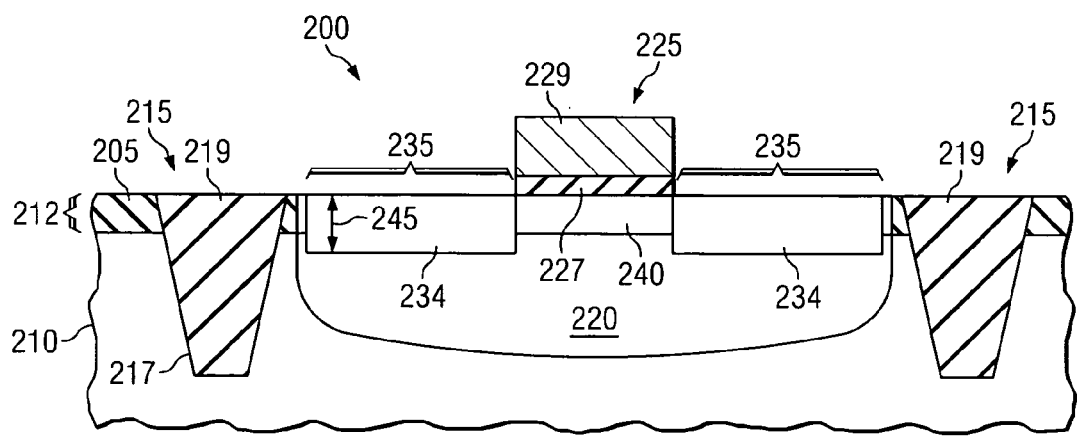
Figure 2E:
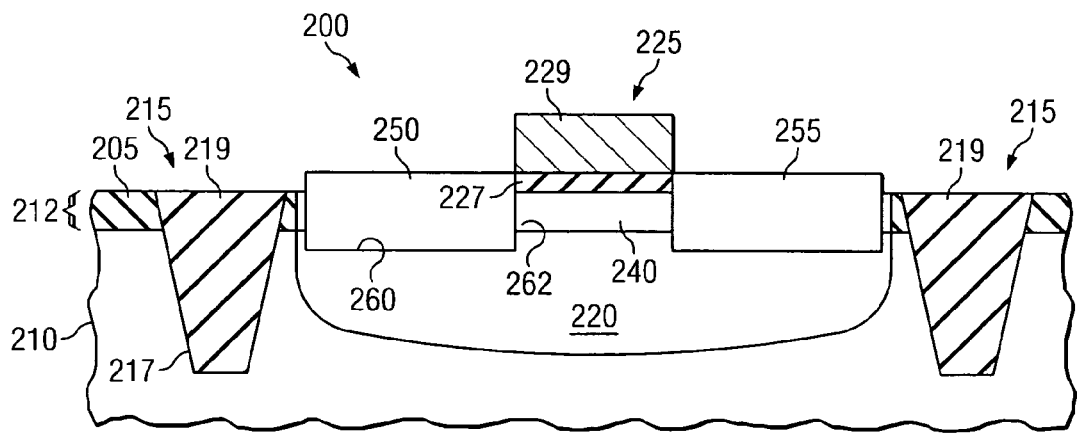

Turning now to FIG. 2D, shown is the partially completed PMOS device 200 after removing portions 235 of the tensile-strained silicon layer 205 and silicon-germanium substrate 210 outside of a channel region 240. Alternatively, in some instances, the portion removed 235 is in the tensile-strained silicon layer 205 only. In some embodiments, the thickness 245 of the tensile-strained silicon layer 205 removed is between about 1 to about 10 nanometers. In certain advantageous embodiments, the thickness 245 removed is about 5 to 6 nanometers. In other embodiments, the thickness 245 removed is substantially the same as the tensile-strained silicon layer's 205 thickness 212. In yet other embodiments, no portions of the strained silicon layer are removed.

Depicted in FIG. 2E is the partially completed PMOS device 200 after epitaxially growing silicon-germanium source/drain structures 250, 255 on or in the tensile-strained silicon layer 205 and outside the channel region 240. As illustrated in FIG. 2E, in some instances, the source/drain structures 250, 255 are grown on a surface 260 of the substrate 210. Any conventional epitaxial growth procedure can be used to form the silicon-germanium source/drain structures 250, 255. In certain preferred embodiments, as discussed above, the silicon-germanium source/drain structures 250, 255 are adjacent sides 262 of the channel region 240 so as to impart compressive stress into the channel region 240. In some embodiments, the epitaxial growth procedure includes depositing a mixture of silicon, a p-type dopant, such as boron, and germanium atoms, where the mixture has between about 30 atom percent and about 50 atom percent germanium. One skilled in the art would understand that forming the silicon-germanium source/drain structures 250, 255 refers to forming deep source/drains, source/drain extensions or both. Although not depicted in FIGS. 2A–2E, one skilled in the art would also understand that the manufacture of the PMOS device could also include conventional steps to form other device components, such as gate sidewall structures.

Figure 3:
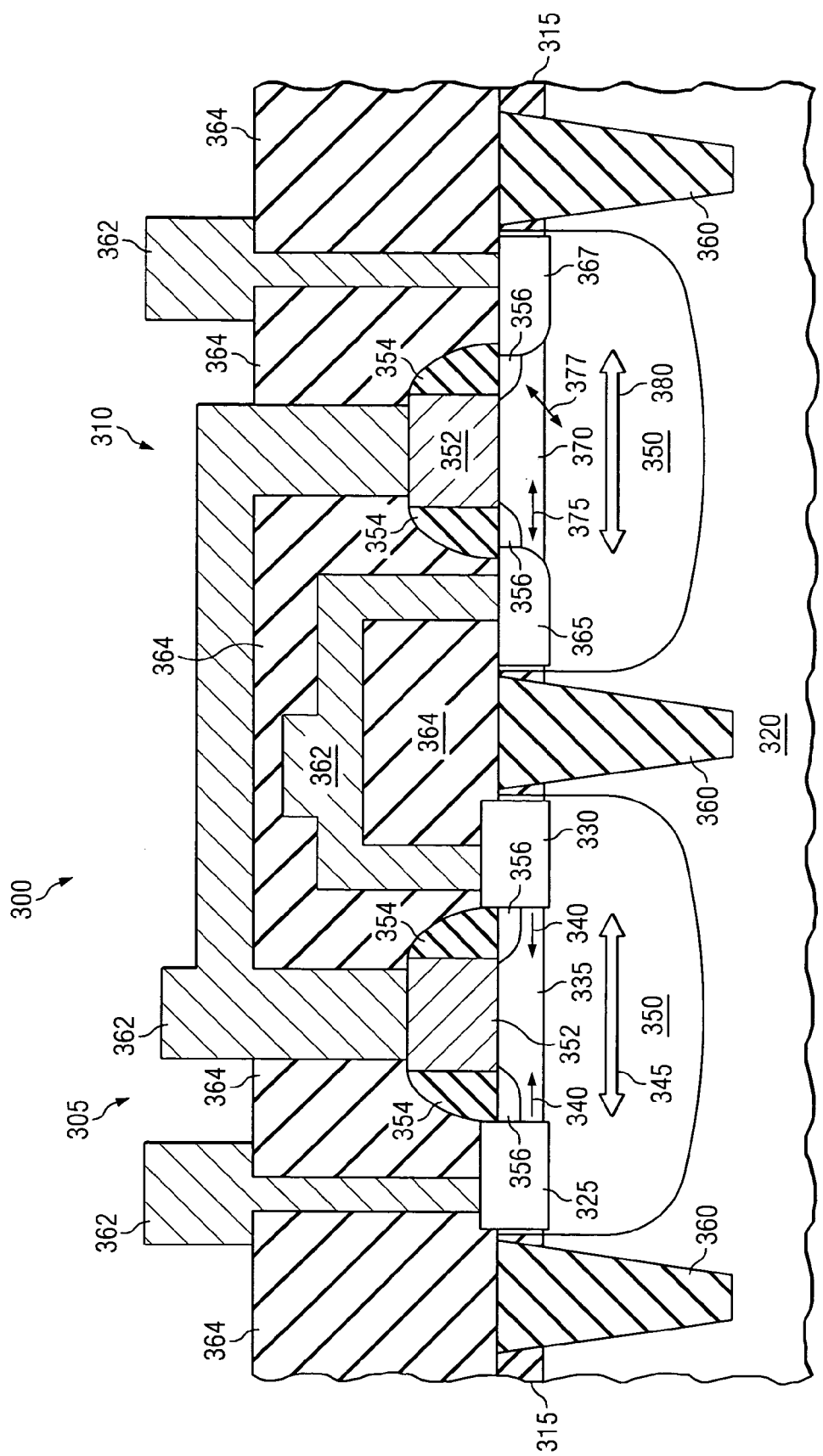
FIG. 3 illustrates a partial sectional view of an MOS device of the present invention.

Still another embodiment of the present invention, a metal oxide semiconductor (MOS) device 300, is illustrated in FIG. 3. In certain preferred embodiments, the MOS device 300 includes a PMOS transistor 305 and an NMOS transistor 310. Any of the above-described embodiments of the PMOS device 100 and methods for manufacturing the PMOS device 200 illustrated in FIGS. 1 and 2A–2E, respectively, may be used to fabricate the PMOS transistor 305 of the MOS device 300.

For instance, as depicted in FIG. 3, the PMOS transistor 305 includes a tensile-strained silicon layer 315 located on a silicon-germanium substrate 320 and p-doped silicon-germanium source/drain structures 325, 330 located on or in the tensile-strained silicon layer 315. The silicon-germanium source/drain structures 325, 330 could be located on the tensile-strained silicon layer 315 or the silicon-germanium substrate 320. The PMOS transistor 305 also includes an n-type channel region 335 located between the p-doped silicon-germanium source/drain structures 325, 330 and within the tensile-strained silicon layer 315. Similar to that discussed above, the n-type channel region 335 has a compressive stress 340 in a direction parallel to an intended current flow 345 through the n-type channel region 335. As also discussed above, this results in an improved mobility of holes through the n-type channel region 335 and a higher drive current for the PMOS transistor, as compared to an analogous PMOS transistor having a channel made of unstrained silicon.

Of course, the PMOS and NMOS transistors 305, 310 can include other conventional structures to form operative transistors, such as doped wells 350 in the tensile-strained silicon layer 315, gate structures 352, gate sidewalls 354, and source/drain extensions 356. Also, the MOS device 300 can include isolation structures 360, analogous to that described above, and the PMOS and NMOS transistors 305, 310 can be coupled via interconnects 362 in one or more dielectric layers 364 so as to form the operative complementary metal oxide semiconductor (CMOS) transistor device 300.

The NMOS transistor 310 also includes n-doped source/drain structures 365, 367 located in or on the tensile-strained silicon layer 315, or on the substrate 320. The NMOS transistor 310 also includes a p-type channel region 370 located between the n-doped source/drain structures 365, 367 and within the tensile-strained silicon layer 315. Unlike the n-type channel region 335, however, the p-type channel region 370 has tensile stresses in directions parallel 375 and perpendicular 377 to an intended current flow 380 through the p-type channel region 370. This follows from the fact that the n-doped source/drain structures 365, 367 are preferably designed to not apply a substantial compressive stress to the p-type channel region 370.

For example, in some preferred embodiments such as illustrated in FIG. 3, the n-doped source/drain structures 365, 367 are formed by conventional implantation and annealing procedures. For instance, n-type dopants such as arsenic or phosphorus can be implanted and thermally diffused into a portion of the tensile-strained silicon layer 315, to form the source/drain structures 365, 367. Such source/drain structures 365, 367 do not apply a substantial compressive stress to the p-type channel region 370.

Alternatively, the n-doped source/drain structures 365, 367 can be formed in a fashion similar to that described above to form the source/drain structures 325, 330 for the PMOS transistor 305. That is, a portion of the tensile-strained silicon layer 315 can be removed, and the n-doped source/drain structures 365, 367, are epitaxially grown on or in the tensile-strained silicon layer thereby exposed. In some cases, the source/drain structures are 365, 367 grown on the silicon layer 315, while in other cases, it is grown on the substrate 320. Although the n-doped source/drain structures 365, 367 could comprise a silicon-germanium alloy, in some instances, the compressive stress imparted to the p-type channel region 370 by such an alloy could undesirably decrease strain in the direction parallel to the intended direction of current flow 380. Rather, in certain preferred embodiments, the n-doped source/drain structures 365, 367 comprise a silicon-carbon alloy. Silicon-carbon source/drain structures 365, 367 cause an increase in tensile stress 375 in the direction parallel to the intended direction of current flow 380, and thereby increase tensile strain in the parallel direction. This, in turn, beneficially increases the mobility of electrons through the p-type channel region 370.

Consequently, preferred embodiments of the p-type channel region 370 of the NMOS transistor 310 have biaxial strain, comprising tensile strain in directions parallel and perpendicular to the intended direction of current flow 380. This, in turn, improves the carrier mobility and drive current of the NMOS transistor 310. For example, the NMOS transistor's 310 p-type channel region 370 can have a mobility of electrons per GPa of tensile stress in directions parallel 375 and perpendicular 377 to an intended current flow 380 that is at least about 50 percent greater than a mobility in an analogous NMOS transistor having a channel region in an unstrained silicon layer. As another example, similar to the PMOS transistor 305, the NMOS transistor 310 can have a drive current that is substantially higher (e.g., at least about 15 percent) than a drive current of a substantially similar NMOS device having a channel made of an unstrained silicon layer.

Although the present invention has been described in detail, one of ordinary skill in the art should understand that they can make various changes, substitutions and alterations herein without departing from the scope of the invention.

What is claimed is:

1. A P-type Metal Oxide Semiconductor (PMOS) device, comprising:
    a tensile-strained silicon layer located on a silicon-germanium substrate;
    silicon-germanium source/drain structures on or in said tensile-strained silicon layer; and
    a channel region located between said silicon-germanium source/drain structures and within said tensile-strained silicon layer, said channel region further having a compressive stress in a direction parallel to an intended current flow through said channel region,
        wherein said compressive stress is substantially equal to or greater in magnitude than a tensile stress of said tensile-strained silicon layer in said direction.

2. The PMOS device recited in claim 1, wherein said channel region has a net strain in said parallel direction that is compressive.

3. The PMOS device recited in claim 1, wherein said channel region has a net strain in said parallel direction that is substantially zero.

4. The PMOS device recited in claim 1, wherein said silicon-germanium substrate comprises an alloy having between about 20 and about 30 atom percent germanium.

5. The PMOS device recited in claim 1, wherein a magnitude of said compressive stress is at least about 1 GPa.

6. The PMOS device recited in claim 1, wherein said channel region has a mobility of holes per GPa of tensile stress in a direction perpendicular to said direction is at least about 66 percent greater than a mobility in a substantially similar channel made of unstrained silicon.

7. The PMOS device recited in claim 1, wherein said PMOS device has a drive current that is at least about 15 percent higher than a drive current of a substantially similar PMOS device having a channel made of an unstrained silicon layer.

8. The PMOS device recited in claim 1, wherein said silicon-germanium source/drain structures comprise an alloy having between about 30 and about 50 atom percent germanium.

9. A P-type Metal Oxide Semiconductor (PMOS) device, comprising:
    a tensile-strained silicon layer located on a silicon-germanium substrate;
    silicon-germanium source/drain structures on or in said tensile-strained silicon layer, wherein said silicon-germanium source/drain structures comprise an alloy having between about 30 and about 50 atom percent germanium; and
    a channel region located between said silicon-germanium source/drain structures and within said tensile-stained silicon layer, said channel region further having a compressive stress in a direction parallel to an intended current flow through said channel region.

10. A Metal Oxide Semiconductor (MOS) device, including:
    a P-type Metal Oxide Semiconductor (PMOS) transistor, comprising:

a tensile-strained silicon layer located on a silicon-germanium substrate;
p-doped silicon-germanium source/drain structures on or in said tensile-strained silicon layer; and
an n-type channel region located between said p-doped silicon-germanium source/drain structures and within said tensile-strained silicon layer, said n-type channel region further having a compressive stress in a direction parallel to an intended current flow through said n-type channel region,
  wherein said compressive stress is substantially equal to or greater in magnitude than a tensile stress of said tensile-stained silicon layer in said direction; and
an N-type metal Oxide Semiconductor (NMOS) transistor, comprising:
  n-doped source/drain structures located in or on said tensile-strained silicon layer; and
  a p-type channel region located between said n-doped source/drain structures and within said tensile-strained silicon layer, said p-type channel having a tensile strain in directions parallel and perpendicular to an intended current flow through said p-type channel region.

11. The MOS device as recited in claim 10, wherein said n-type channel has a mobility of holes per GPa of tensile stress in a direction perpendicular to said intended current flow through said n-type channel region that is at least about 66 percent greater than a mobility in a substantially similar channel made of unstrained silicon.

12. The MOS device as recited in claim 10, wherein said p-type channel region has a mobility of electrons per GPa of tensile stress in a direction parallel and perpendicular to said intended current flow through said p-type channel region that is at least about 48 percent greater than a mobility in a substantially similar channel region in an unstrained silicon layer.

13. The MOS device as recited in claim 10, wherein said n-doped source/drain structures are implanted in said tensile-strained silicon layer.

14. The MOS device as recited in claim 10, wherein said n-doped source/drain structures are epitaxially grown in said tensile-strained silicon layer exposed by removing portions of said tensile-strained silicon layer.

15. The MOS device as recited in claim 10, wherein said n-doped source/drain structures comprise a silicon-carbon alloy.

16. The MOS device as recited in claim 10, wherein said PMOS and NMOS transistors are interconnected to form a complementary metal oxide semiconductor (CMOS) transistor device.

* * * * *